United States Patent
Hemingway et al.

(10) Patent No.: US 9,653,897 B2
(45) Date of Patent: May 16, 2017

(54) OUTDOOR ELECTRICAL BOX

(71) Applicant: The Wiremold Company, West Hartford, CT (US)

(72) Inventors: Jeffrey Hemingway, Burlington, CT (US); Richard R. Picard, West Hartford, CT (US); Steven C. Thibault, Harwinton, CT (US)

(73) Assignee: The Wiremold Company, West Hartford, CT (US)

( * ) Notice: Subject to any disclaimer, the term of this patent is extended or adjusted under 35 U.S.C. 154(b) by 0 days.

(21) Appl. No.: 15/240,299

(22) Filed: Aug. 18, 2016

(65) Prior Publication Data

US 2016/0359305 A1    Dec. 8, 2016

Related U.S. Application Data

(63) Continuation-in-part of application No. 14/593,441, filed on Jan. 9, 2015.

(60) Provisional application No. 62/084,102, filed on Nov. 25, 2014.

(51) Int. Cl.
| | |
|---|---|
| *H02G 3/18* | (2006.01) |
| *H02G 3/08* | (2006.01) |
| *H02G 3/14* | (2006.01) |
| *H05K 5/02* | (2006.01) |

(52) U.S. Cl.
CPC .............. *H02G 3/081* (2013.01); *H02G 3/14* (2013.01); *H02G 3/185* (2013.01); *H05K 5/0221* (2013.01); *H05K 5/0226* (2013.01)

(58) Field of Classification Search
CPC combination set(s) only.
See application file for complete search history.

(56) References Cited

U.S. PATENT DOCUMENTS

| | | | |
|---|---|---|---|
| 5,342,993 A * | 8/1994 | Siems | H02G 3/185 174/481 |
| 5,575,668 A | 11/1996 | Timmerman | |
| 8,530,757 B2 | 9/2013 | Dinh | |

* cited by examiner

*Primary Examiner* — Dhirubhai R Patel
(74) *Attorney, Agent, or Firm* — McCormick, Paulding & Huber LLP

(57) ABSTRACT

An electrical box includes a body, a cover that is movable relative to the body, and an electrical connection point that is mounted to the cover. The electrical connection point may be one or more of an electrical receptacle, a data jack, and/or the like. The cover may be attached to the body by a sliding hinge connection or a sliding pin connection that allows the cover to rotate relative to the body as well as translate relative to the body. An air pocket substantially filling a compartment in the cover is maintained during an opening or closing of the electrical box.

19 Claims, 15 Drawing Sheets

OUTDOOR ELECTRICAL BOX

CROSS-REFERENCE TO RELATED APPLICATIONS

This application is a continuation-in-part of U.S. application Ser. No. 14/593,441, filed on Jan. 9, 2015, which claims the benefit of U.S. Provisional Patent Application No. 62/084,102, filed Nov. 25, 2014, each of which is hereby incorporated by reference in its entirety.

FIELD OF THE PRESENT DISCLOSURE

The present disclosure relates to outdoor power distribution and, more particularly, to an electrical box that can be located outdoors in the ground and that houses electrical connection points such as electrical receptacles or data or AV connections that remain sheltered from the elements but are also easily accessible.

BACKGROUND OF THE PRESENT DISCLOSURE

Electrical power has been a part of modern life for more than a century and has become a familiar indoor convenience. Indoors, almost every appliance for daily use requires electrical power. However, outdoor access to electrical power cannot yet be described as convenient.

For those who use electrically powered equipment and devices outdoors, provision of electrical power presents immediate difficulties. For larger equipment and devices, batteries are not practical. While vertical wall-mounted receptacles are known for outdoor power distribution, such receptacles require use of an extension cord to distribute power to any significant distance from the wall. The inconveniences associated with use of an extension cord, such as a tripping hazard, essentially limit outdoor power distribution to locations near the wall-mounted receptacle.

In order to provide electrical power at locations distant from existing walls, various devices have been proposed. For example, post-mounted outdoor receptacles have been provided. However, the post-mounted receptacles can be visually obtrusive. Additionally, the post-mounted receptacles are prone to inadvertent displacement or damage due to their protruding structure.

Electrical boxes for mounting electrical connection points outdoors in the ground are known. Moisture is one issue with enclosures installed in the ground. While some current electrical boxes attempt to prevent the electrical connection points from getting wet, they do so by sacrificing accessibility. Those current boxes are best suited for applications requiring a long-term electrical connection such that once the connection is made, a user does not need to often access that connection. Those current enclosures are not well suited for applications where a variety of devices that consume electrical power must be routinely connected or disconnected from the connection points. Other known outdoor electrical boxes do attempt to be accessible, but those boxes only make limited attempts to keep water from reaching the faces of the electrical receptacles and the contact points between the receptacles and the terminals of the plugs connected to the receptacles.

For example, in an athletic field, a large public flower garden, or a public park, it may be desirable to provide electrical receptacles for intermittent electrical connections, such as short-term lighting, power washers, and electric maintenance equipment, e.g., hedge trimmers and chain saws. It may also be desirable to provide data or AV connections in these locations, e.g., when no wireless network is available in the area. The connection points must be accessible so that a user can plug and unplug devices as required. Additionally, the electrical box housing such receptacles or data or AV jacks must be able to keep water out of them.

Accordingly, it is desirable to have an electrical box that can be installed in the ground outdoors and that can house electrical connection points that are highly accessible so that intermittent electrical connections can be made but that at the same time are protected from the elements so that the connection points are not damaged and do not present an electrocution hazard.

BRIEF SUMMARY OF THE PRESENT DISCLOSURE

According to the present disclosure, an electrical box comprises a body, a cover that is movable relative to the body, and an electrical connection point that is mounted to the cover. The electrical connection point may be one or more of an electrical receptacle, a data jack, and/or the like.

According to embodiments, the cover may be attached to the body by a sliding hinge connection that allows the cover to rotate relative to the body as well as translate relative to the body. An air pocket substantially filling a compartment in the cover may be maintained during an opening or closing of the electrical box due to the translation of the cover relative to the body.

These and other objects, features and advantages of the present disclosure will become apparent in light of the detailed description of embodiments thereof, as illustrated in the accompanying drawings.

DETAILED DESCRIPTION OF THE DRAWINGS

Figure 1:
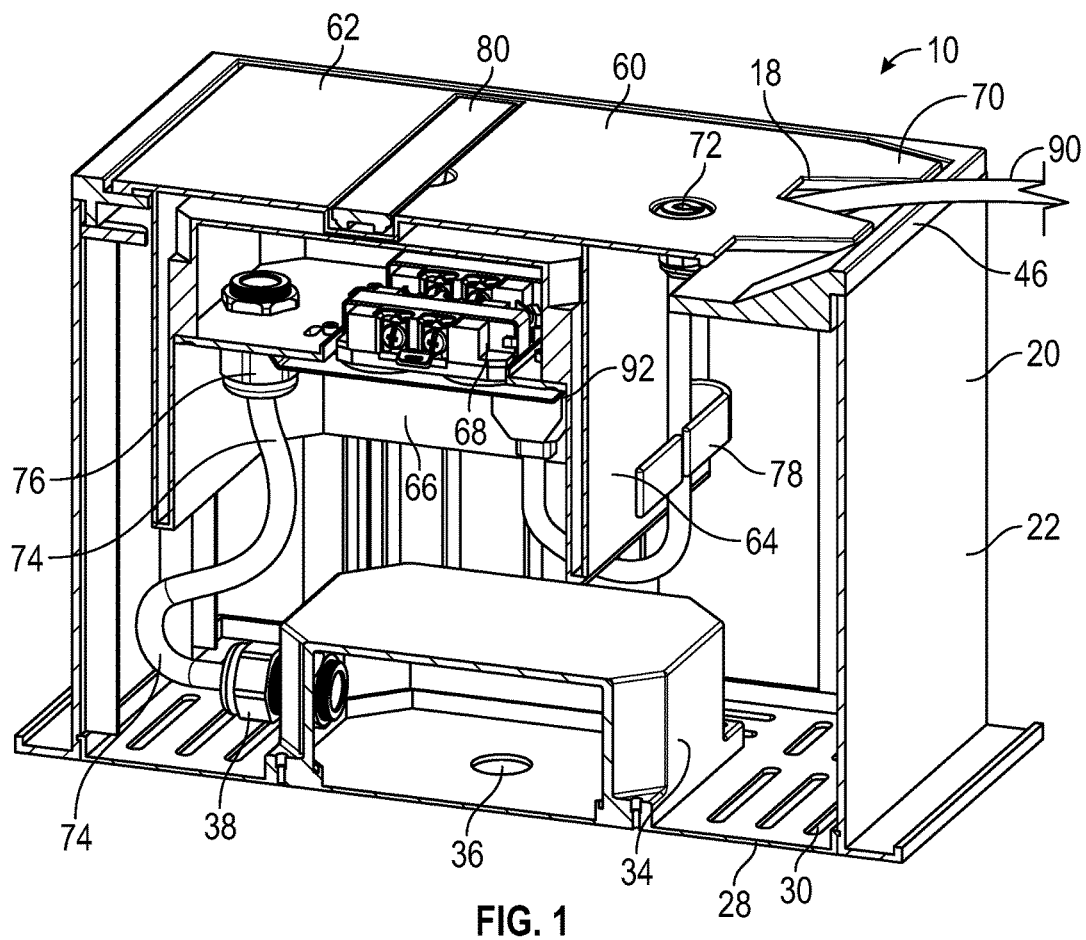
FIG. 1 shows a perspective cut-away view of an electrical box according to one embodiment of the present disclosure.
Figure 2:
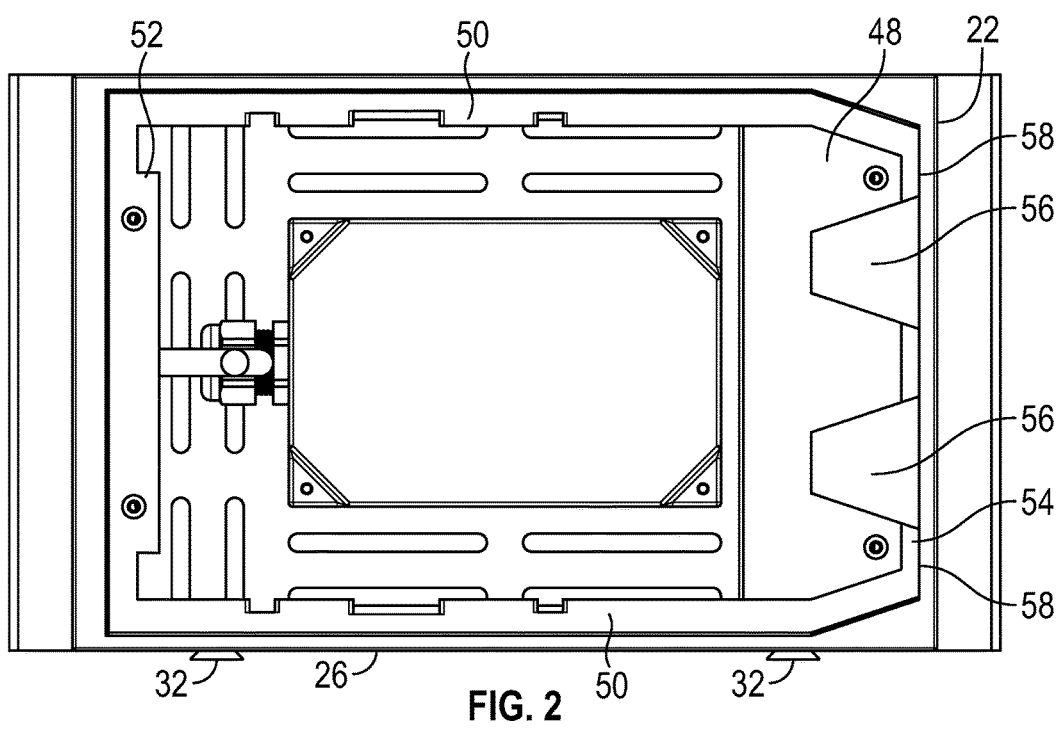
FIG. 2 shows a top view of the electrical box shown in FIG. 1 with the cover removed.
Figure 3:
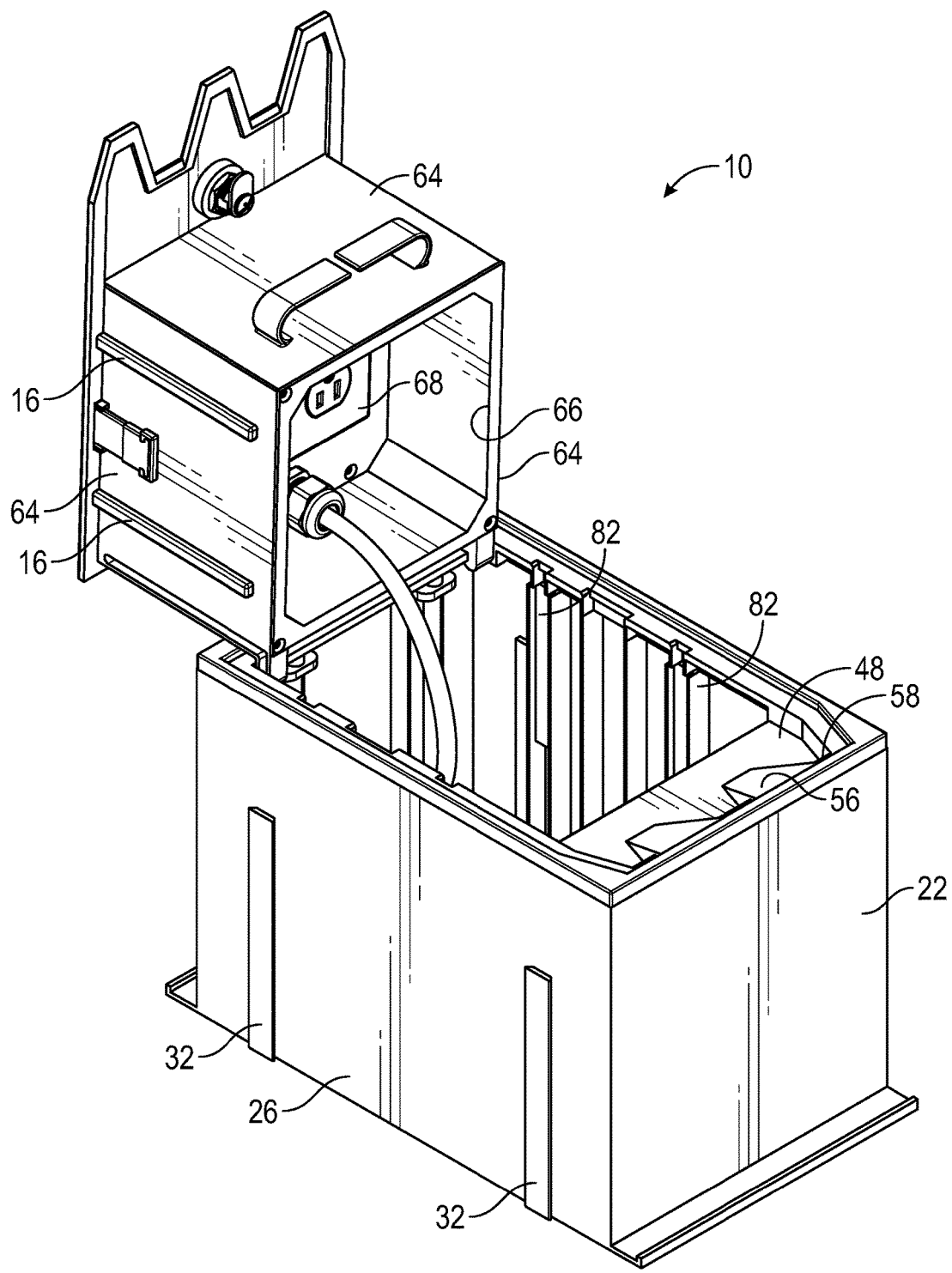
FIG. 3 shows a perspective view of the electrical box shown in FIG. 1 with the cover in the fully open position.

FIGS. 1-7 depict an electrical box 10 according to an embodiment of the present disclosure. The electrical box 10 is for installation outdoors in the ground and allows for easy access to the electrical receptacles while protecting them from water. The electrical box includes a body 20 and a cover 60 that is connected to the body through a hinge connection 12. The body 20 is open at the top. It has a front wall 22, a back wall 24, side walls 26, and a bottom 28. The bottom 28 has openings 30 that drain water inside of the electrical box. As shown in FIG. 3, the body 20 also may include male and female dovetails 32 that may be used to connect two electrical boxes 10 together if desired as will be described in more detail below.

The cover 60 contains a top piece 62 and four side walls 64. The cover is open at the bottoms of the side walls 64. The side walls 64 and the bottom surface of the top piece 62 of the cover create a compartment 66. Receptacles 68 are installed inside of the compartment closer to the bottom surface of the top piece 62 than to the bottoms of the side walls 64. The side walls 64 extend below the front face of the receptacles 68. The extension of the side walls 64 advantageously provide protection for power cord plugs from contact with water that may get into the electrical box 10.

The two side walls 64 that are adjacent to the side walls 26 of the body each contain a track 84 that has a short slot 86 and a long slot 88 that extends 90 degrees from the short slot. The short slot 86 and the long slot 88 are connected to each other to create a continuous track 84.

The top piece 62 of the cover 60 extends laterally past the four side walls 64. The laterally extended portion of the top piece 62 includes a series of fingers 70. Additionally, the laterally extended portion of the top piece supports a lock 72 for locking the electrical box.

One end of a power cable 74 can be attached to a plate that supports the receptacles 68 using a cable connector 76. The wires inside the power cable 74 can be electrically connected to the receptacles 68 in a conventional manner, such as through screw terminals.

The outer surface of the side wall 64 of the cover that is farthest from the hinge connection 12 and closest to the fingers 70 has cable guide 78 that guides a power cord 90 that can be plugged in to one of the receptacles.

A cover flange 46 is connected to the top of the body 20. The cover flange contains a large extension 48 on its inner periphery on the front side of the box and extensions 50 on its inner periphery on the side of the box and extension 52 on its inner periphery on the back of the box. The extension 52 on the inner periphery of the cover flange at the back of the box supports stationary hinge pins 14 of the hinge connection 12. The large extension 48 on the inner periphery of the cover flange at the front of the box contains a flat surface 54 for supporting a gasket (not shown) and a sloped surface 56. The sloped surface contains a series of grooves 58 at the top of the cover flange. The fingers 70 of the top piece 62 of the cover 60 rest in the grooves 58 when the cover is closed. The sloped surface creates cable egress space 18 when the cover is closed by which the power cord 90 can exit the electrical box 10.

The top surfaces of extensions 50 and 52 can also support gaskets (not shown) along with flat surface 54 on extension 48. The gaskets provide some amount of weatherproofing for electrical box 10. But as the present disclosure makes apparent, electrical box 10 need not be completely waterproof, as the electrical box contains features that keep water away from the electrical connections inside of the electrical box.

As described in more detail below with reference to FIGS. 3-6, the hinge connection 12 is a sliding hinge connection that permits the cover 60 to both rotate around the hinge pin 14 and to translate within the body 20.

An enclosure 34 extends from the bottom wall 28 of the body 20. The enclosure 34 can be boxed-shaped. The enclosure 34 can be constructed as a NEMA Type 6 enclosure. NEMA stands for National Electrical Manufacturer's Association. A NEMA Type 6 enclosure is designed to be impenetrable to water during occasional submersions in water. An opening 36 is formed in the bottom 28 of the body 20. The opening 36 provides access to the interior of the enclosure 34.

Figure 7:
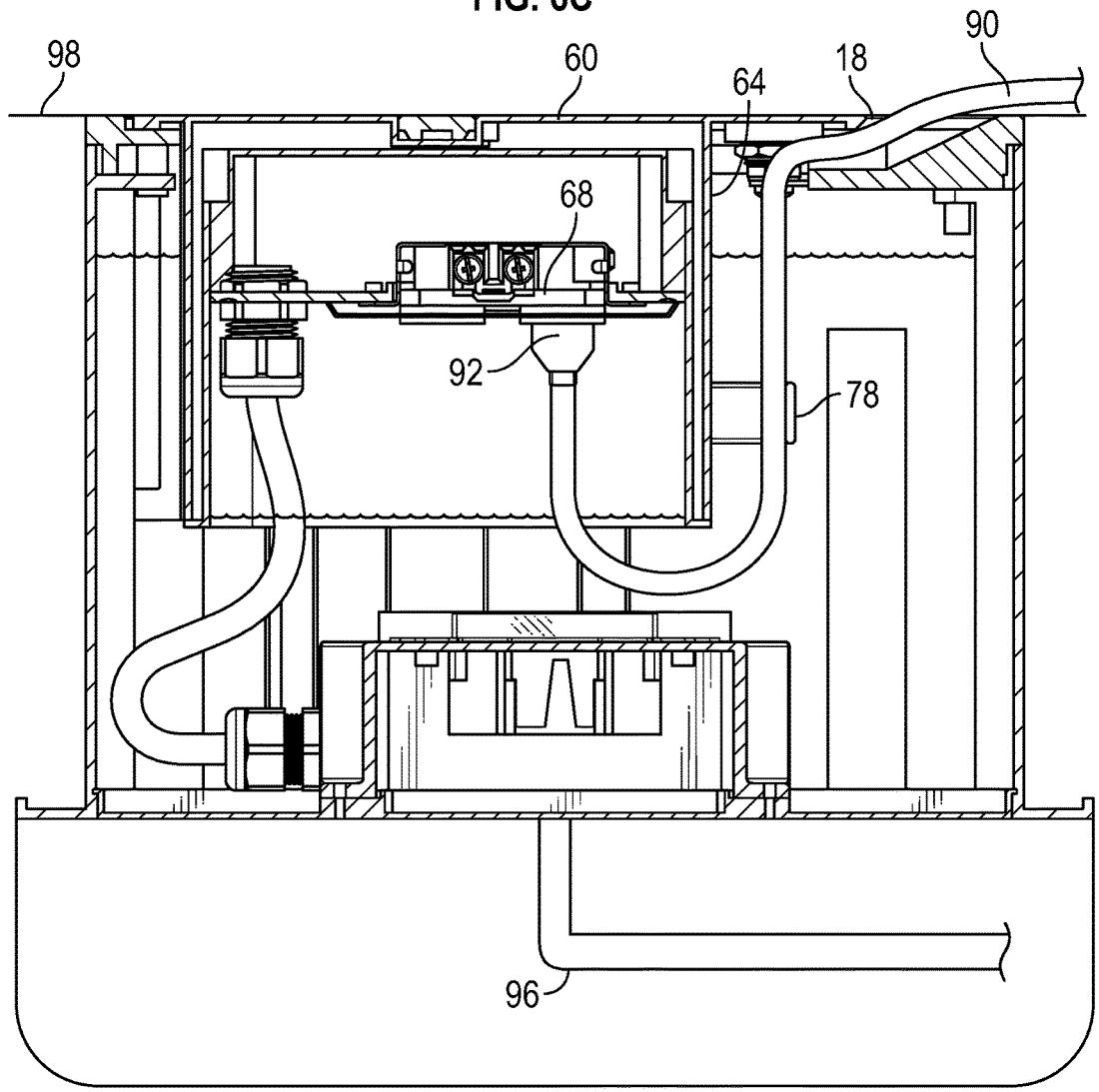
FIG. 7 shows a schematic cross-sectional view of the electrical box shown in FIG. 1 that is installed in the ground and that is filled with water.

As shown in FIG. 7, the electrical box 10 is fully installed in the ground 98 on top of a solid or flexible conduit 96. The conduit can be made of poly-vinyl-chloride or PVC. Power wires from a power mains such as the nearest building to the installation location of the electrical box 10 can be routed through the conduit and into the enclosure box 34 through the opening 36. Inside the enclosure box 34, the power wires from the power mains can be electrically connected to the power wires inside of power cable 74 in any conventional manner, such as through use of wire nuts. Because enclosure 34 is water impenetrable, the electrical connection between the power wires from the power mains and the power wires inside the power cable 74 will not be exposed to water even when the electrical box 10 is filled with water, thus preventing that electrical connection from presenting an electrocution risk when the electrical box is filled with water. Power cable 74 can be connected to enclosure 34 using a suitable cord connector 38 that preserves the water impenetrability of enclosure 34.

Figure 4:
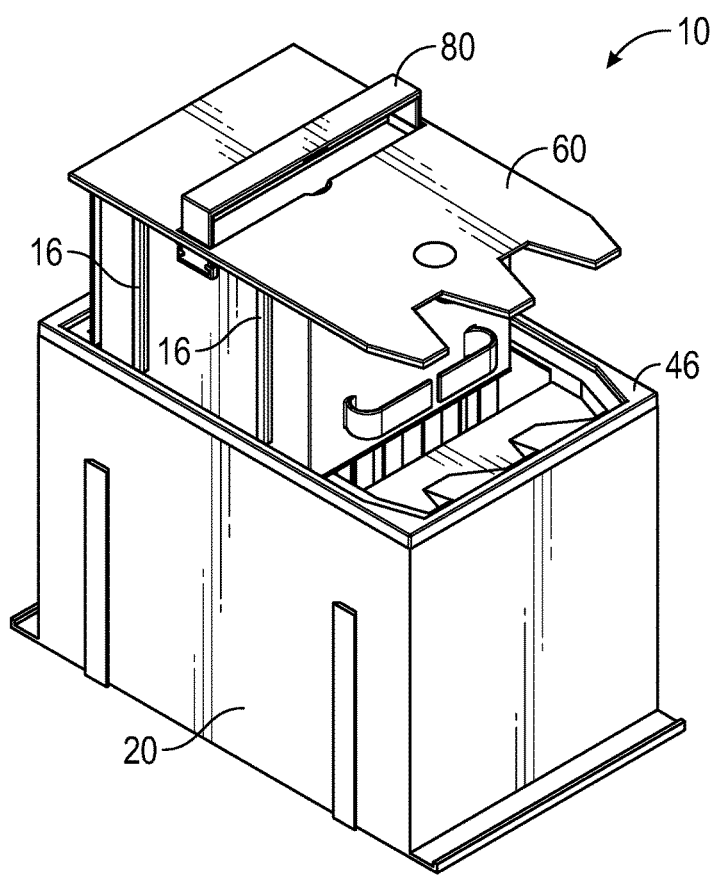
FIG. 4 shows a perspective view of the electrical box shown in FIG. 1 with the cover rotated to the angular position it has in the fully closed position but not yet translated to the vertical position it has in the fully closed position.
Figure 5:
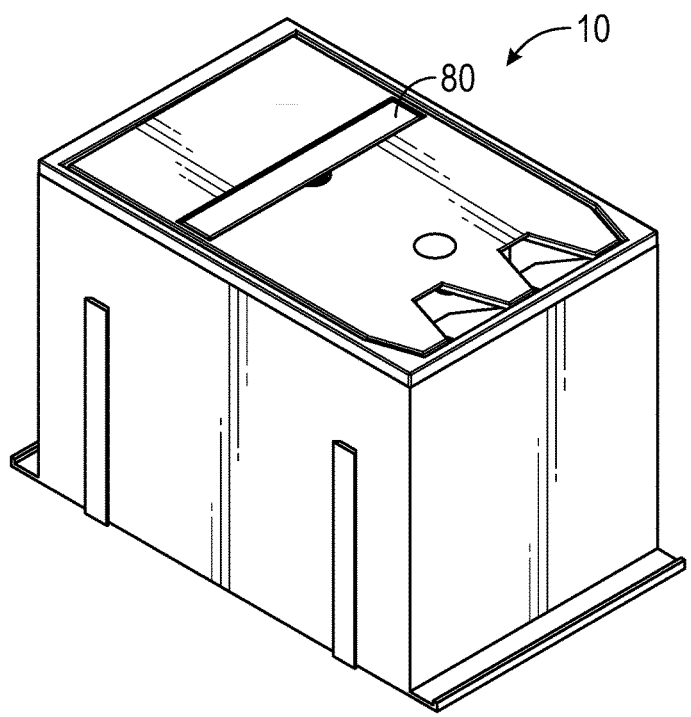
FIG. 5 shows a perspective view of the electrical box shown in FIG. 1 with the cover in the fully closed position.
Figure 6A:
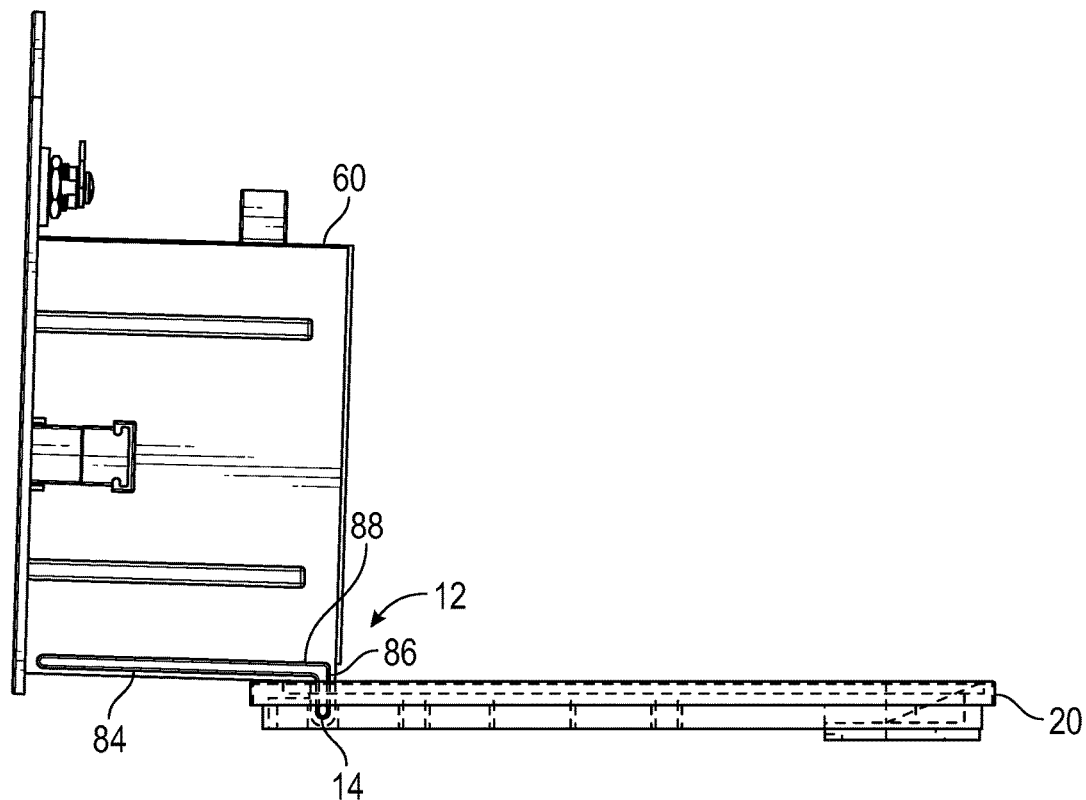
FIG. 6A is a schematic representation of the hinged connection in the position where the cover is in the fully open position.
Figure 6B:
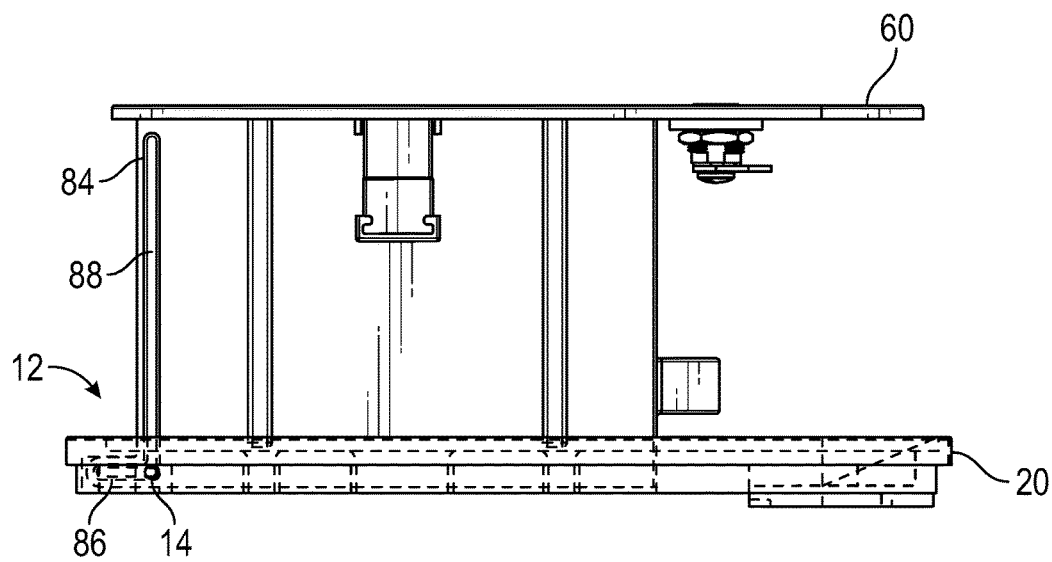
FIG. 6B is a schematic representation of the hinged connection in the position where the cover is fully rotated to the angular position it has in the fully closed position but has not yet translated to the vertical position it has in the fully closed position.
Figure 6C:
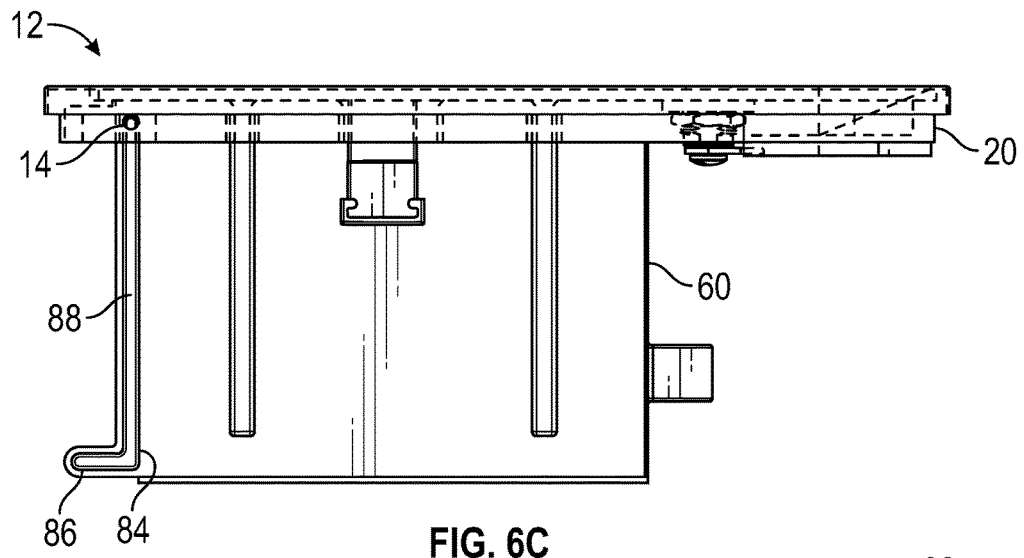
FIG. 6C is a schematic representation of the hinged connection in the broken state due to downwards translation of the cover towards its fully closed position.

FIGS. 3-6C show the operation of the sliding hinge connection 12. When cover 60 is in its fully open position, as seen in FIGS. 3 and 6A, the faces of the receptacles 68 are substantially in a vertical orientation. This orientation makes it easy for a person to plug or unplug power cords such as power cord 90 to the receptacle sockets. Cover 60 can be manipulated into the fully opened position using a handle 80 that slides within the cover from an operative position, as seen in FIG. 4, to an inoperative position, as seen in FIG. 5, at which it is flush with the cover 60. The cover 60 is closed by first rotating it about the stationary hinge pins 14 of the hinge connection 12 until the bottoms of the side walls 64 of the cover are level with the bottom of cover flange 46 and the top of the body 20, as seen in FIGS. 4 and 6B. As the cover rotates about the stationary hinge pins 14, each hinge pin 14 travels from one end of the short slot 86 in the track 84 in the side wall of the cover adjacent to that hinge pin to the other end of the short slot in the track. At this position of the cover 60, the faces of the receptacles are approximately in a horizontal orientation, but are positioned above the top of the cover flange 46 such that the front faces of the receptacles are located outside of the body 20. Additionally, at this position of the cover 60, guide extensions 16 on the outer surfaces of the side walls 64 line up with tracks 82 in the inner surfaces of the side walls 26 of the body 20. Once the cover 60 is in the position shown in FIGS. 4 and 6B, the cover 60 can be pushed down so that it translates within the body 20 as shown in FIGS. 5 and 6C. As the cover translates downwards, each hinge pin 14 rides in the long slot 88 of the track 84 in the side wall 64 of the cover 60 adjacent to that hinge pin 14. Additionally, the guide extensions 16 slide within the tracks 82 in the inner surfaces of the side walls 26.

FIGS. 5 and 6C show the cover 60 in the fully closed position. In this position, the top piece 62 of the cover 60 is level with the top of the cover flange 46 to create a flush top surface of the electrical box 10.

The purpose of the sliding hinge connection is to maximize the amount of air that remains in the compartment 66 in which the receptacles 68 are mounted when the cover is closed. As seen in FIG. 7, this air creates an air pocket that prevents water from reaching the electrical receptacles 68 and the electrical connections made between the receptacles and the plug terminals that are plugged into the electrical receptacles. Thus, even if the electrical box 10 is filled with water because, for example, the holes 30 in the bottom 28 of the body 20 are clogged such that water is not draining from the electrical box at a fast enough rate, electric current will not leak from the electrical receptacles or from the electrical contacts between the receptacles and plugged in devices through the water because the air pocket will prevent water from reaching the electrical receptacles and the contact points. Requiring the cover to translate downward into the body from the position shown in FIG. 4 maximizes the amount of water that is displaced by the air pocket in the compartment 66 and therefore maximizes the distance between the faces of the receptacles and the water level directly beneath the faces of the receptacles.

FIG. 7 shows a schematic view of electrical box 10 installed in the ground. In the view shown in FIG. 7, power cord 90 having a plug 92 that is plugged in to one of the receptacles 68 and is routed around the bottom surface of one of the side walls 64, through the cable guide 78 and through the cable egress space 18. The routing of power cord 90 around the bottom surface of one of the side walls 64 and through the cable guide 78 provides the power cord 90 with a U-shaped drip loop that prevents water from running along the power cord 90 and contacting the receptacles 68. For instance, if water enters the electrical box 10 through the top of the electrical box 10, for example through the cable egress space 18, the water may only run down the power cord 90 until it reaches the U-shaped drip loop where the power cord passes around the bottom surface of the side wall 64. The U-shaped drip loop prevents further travel of the water into the air pocket in the cover 60 along the power cord 90 because the lowest point of the power cord 90 is at the bottom of the U-shaped drip loop.

In the view shown in FIG. 7, the interior of the electrical box 10 is mostly filled with water. However, the water does not reach the electrical receptacles 68 or the electrical connection points between the terminals of the plug 92 and the receptacle that it is plugged into. Additionally, the water does not reach the interior of the enclosure 34, as that enclosure is impenetrable to water even when it is submerged in it. As such, any water inside of the electrical box does not contact exposed electrical connections such that the water will not conduct electricity from those connections. A user can still safely open the cover 60 of the electrical box 10 without being at risk of electrocution.

The electrical boxes described in this disclosure are able to remain accessible so that a user can safely open and close them to make intermittent electrical connections. The electrical boxes themselves are not designed to be highly water impenetrable. Instead, the receptacles are mounted to the cover of the electrical box and are protected from water inside of the electrical box by a pocket of air below the receptacles. The pocket of air naturally forms when the cover is closed. The pocket of air prevents any water inside the electrical box from reaching the receptacles. Additionally, a water-impermeable enclosure inside the electrical box prevents water from reaching the electrical connections between the main power wires running from, for example, the nearest building and the electrical wires inside the power cable 74 that run to the receptacles. As such, even if the electrical box is filled with water, the water does not present a safety risk to a user in that the electrical connections do not charge the water to create a shock hazard.

The change in volume of the air pocket in response to a change in pressure of the air pocket due to, for example, change in water level and/or changes in temperature of the air pocket can be estimated using the Ideal Gas Law, i.e. PV=nRT. Thus, the change in volume of the air pocket may be described as:

$$V_2 = V_1(P_1/P_2); \text{ and}$$

$$V_2 = V_1(T_2/T_1);$$

where: $V_1$=initial volume; $P_1$=initial pressure; $T_1$=initial temperature; $V_2$=final volume; $P_2$=final pressure; and $T_2$=final temperature.

Using these equations, it is possible to use the Ideal Gas Law to compare changes in air pocket volume due to changes in air pocket pressure versus changes in air pocket temperature to ensure that the height of walls 64 is sufficient to maintain a desired air pocket within the compartment 66 so that at least a minimum distance between the electrical connection point and the water level is maintained. For instance, by way of example, estimated volume changes due to pressure and temperature changes may be compared for an exemplary electrical box having a receptacle/plug compartment 66 volume of 192.1 cubic inches. In this illustrative example, an estimated change in volume of the air pocket from a pressure change from no water submersion to a water submersion of six (6) feet may be compared to an estimated change in volume due to a one (1) inch water submersion with a 70° F. temperature shift in the electrical box.

For pressure change of six (6) feet water submersion;

$P_1$=14.7 psi (atmospheric);

$P_2$=6 ft of H2O=14.7 psi+~2.6 psi=17.3 psi;

thus;

$V_{Receptacle/Plug\ Compartment2}$=192.1×(14.7/17.3)=163.2 in$^3$;

For temperature change of 70° F. shift of one (1) inch water submersion;

$T_1$=100° F.=311 K;

$T_2$=30° F.=272 K;

thus;

$V_{Receptacle/Plug\ Compartment2}$=192.1×(14.7/17.3)=168.0 in$^3$.

In the above comparison, the rise in water level due to temperature will be less than rise due to pressure. It should be understood that the values used in this illustrative example are for exemplary purposes only and that the electrical boxes described herein may be various sizes and may be subjected to various different environmental conditions.

The cover can include LED lighting to improve visibility of the receptacles 68. The cover can also include an indicator light and/or a speaker to notify if water is present in the box.

It should be understood that the receptacles 68 can be replaced with connection points for data or audio-visual connections and power cable 74 can be replaced with a data or audiovisual cable. In this embodiment, wires in the data or audiovisual cable 74 are connected inside the enclosure to wires running through the in-ground conduit. In another embodiment, both receptacles and data or audiovisual sockets are mounted within the compartment 66. In this embodiment, a person having ordinary skill in the art would appreciate that proper separation would need to be maintained between the high-voltage and low-voltage cables.

It should also be understood that power need not be provided to the receptacles 68 through power cable 74. Instead, power may be provided to receptacles 68 wirelessly through one or more inductive coils.

Figure 8:
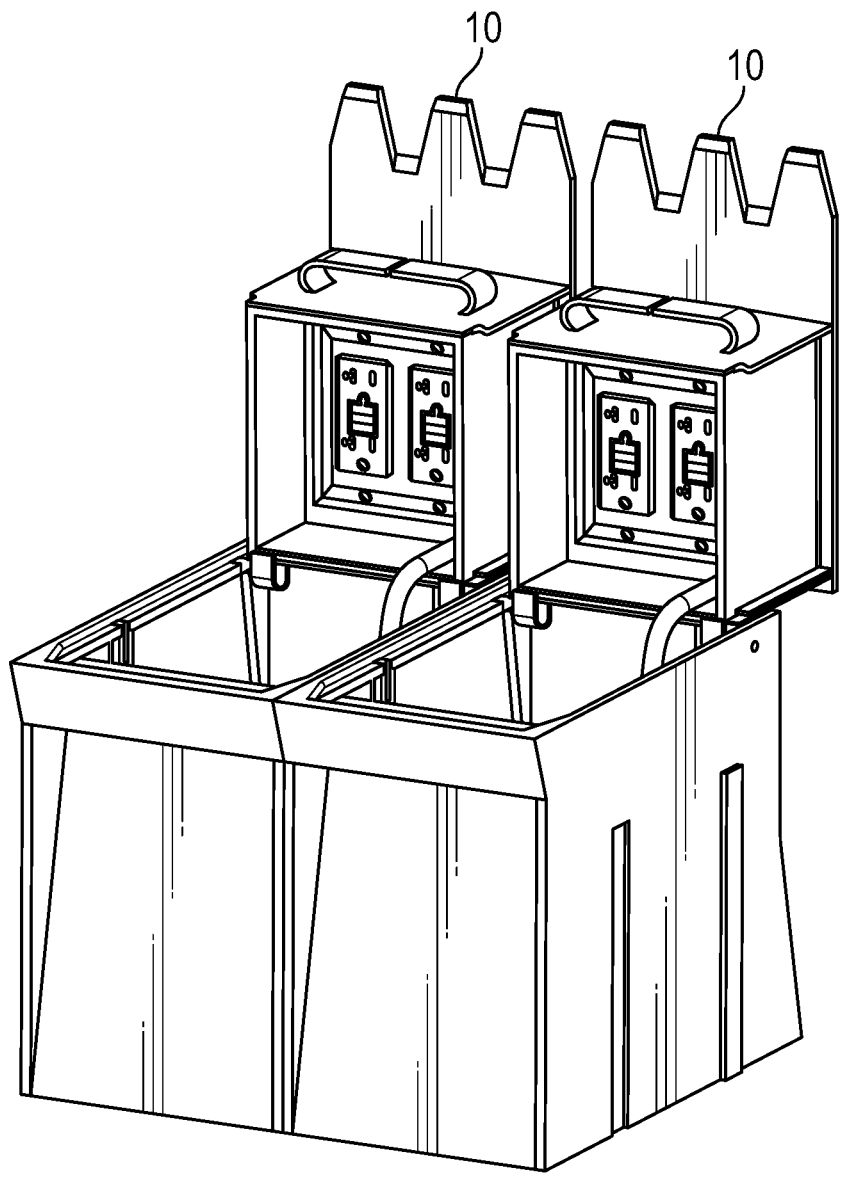
FIG. 8 shows a perspective view of two electrical boxes according to the embodiment of FIG. 1 connected together to create a multi-gang electrical box.
Figure 14:
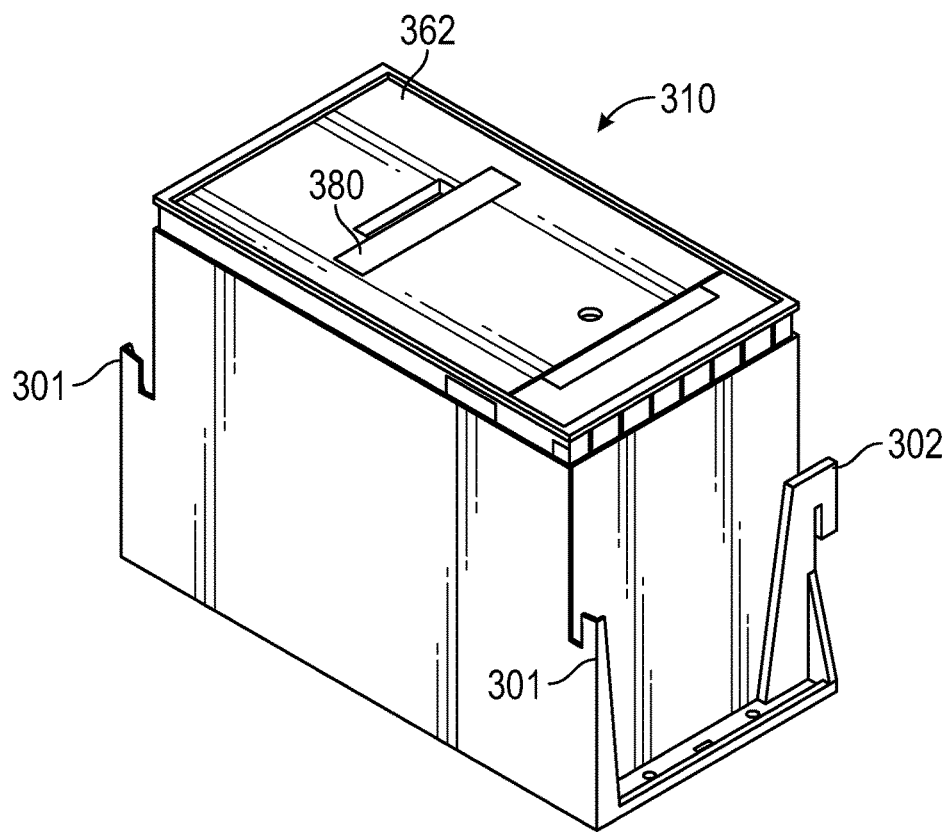
FIG. 14 shows a perspective view of an electrical box according to another embodiment of the present disclosure.

FIG. 8 shows two electrical boxes 10 that are connected together to create a multi-gang box. The connection is made by mating the dovetail connections 32 on one of the boxes with the corresponding dovetail connections 32 on the other box. Alternatively, the connection between two or more electrical boxes may be accomplished in various other ways. For example, the connection(s) may be made through the use of interlocking tabs that may be located on the front wall 22, back wall 24 and/or side walls 26 of the electrical box 10 depending upon the desired connection configuration. For example, FIG. 14 shows an electrical box 310 with interlocking tabs 301, 302 that can interlock with corresponding interlocking tabs 301, 302 of another, similar, electrical box.

Figure 9:
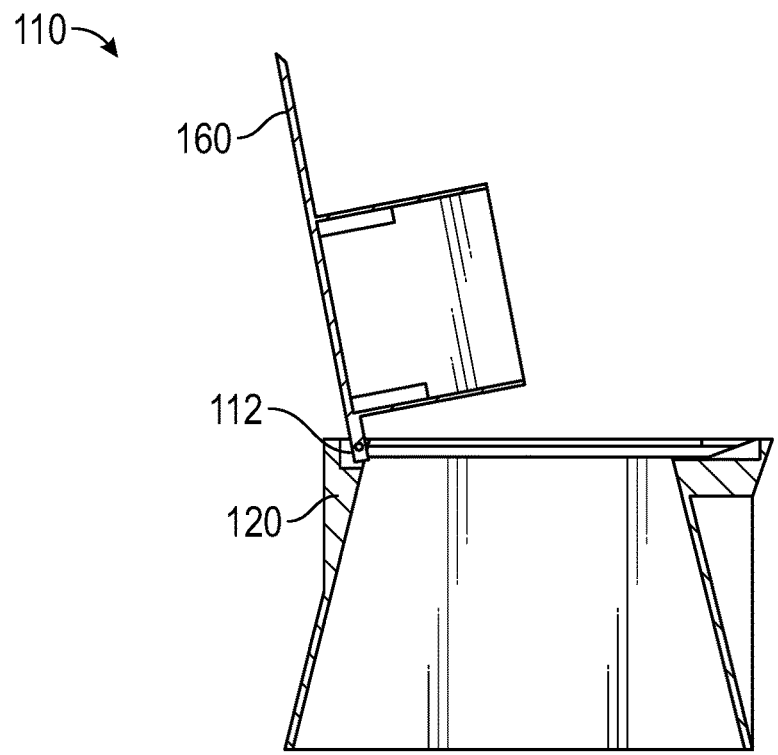
FIGS. 9-10 show the operation of a cover in an electrical box according to another embodiment of the present disclosure.
Figure 10:
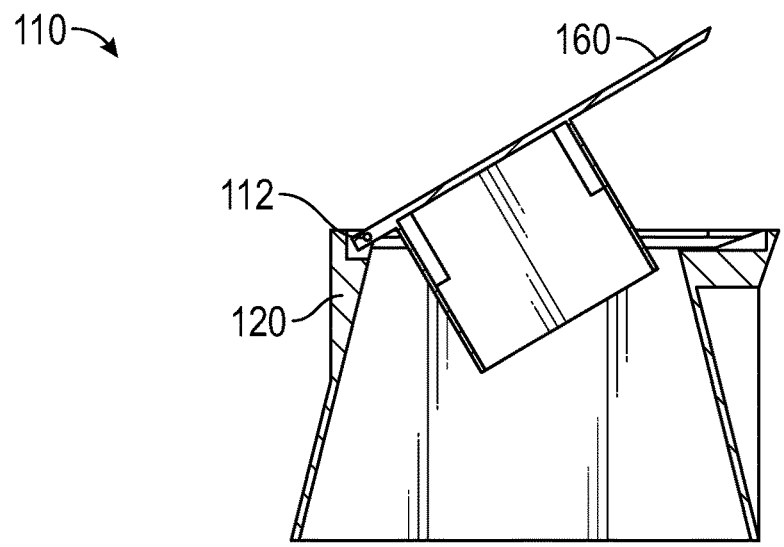

FIGS. 9-10 schematically show an electrical box 110 according to another embodiment of the present disclosure. The electrical box 110 is similar to the electrical box 10 shown in FIGS. 1-6, except that the cover 160 is connected to the body 120 with a regular hinge connection 112 such that the cover 160 can only rotate relative to the body 120.

The cover 160 cannot also translate in the downward direction like the cover 60 in the embodiment shown in FIGS. 1-7 can. In the embodiment shown in FIGS. 9-10, an air pocket will still form below the receptacle faces in the compartment formed by the side walls of the cover. However, when the water level inside the electrical box is at a level such that the air pocket will displace some of the water, the air pocket in the embodiment of FIGS. 9-10 will displace less water than the air pocket below the receptacles in the embodiment of FIGS. 1-7. As such, while the embodiment of FIGS. 9-10 can work to keep the receptacles from contacting water inside the electrical box, the embodiment of FIGS. 1-7 is preferred.

Figure 11:
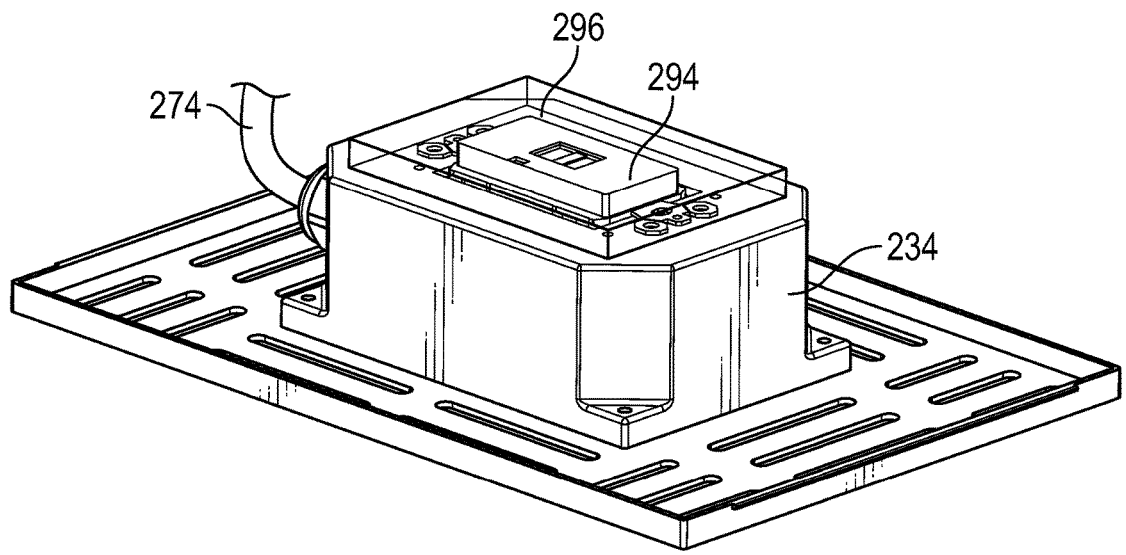
FIG. 11 shows a perspective view of an enclosure inside the electrical box according to another embodiment of the present disclosure.
Figure 12:
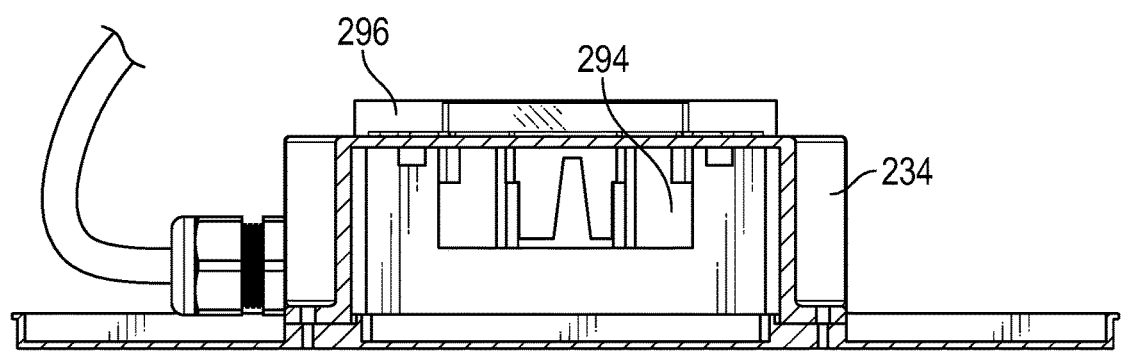
FIG. 12 shows a side cut-away view of the enclosure of FIG. 11.

FIGS. 11-12 show an enclosure 234 of an electric box according to another embodiment of the present disclosure. Unlike enclosure 34 in the embodiment of FIGS. 1-7, enclosure 234 supports a ground fault circuit interrupter 294 that is designed to disconnect electrical power from the receptacles when the ground fault circuit interrupter 294 detects a current leak, which represents a hazardous situation. The ground fault circuit interrupter 294 operates in a conventional manner. The ground fault circuit interrupter 294 is a "dead-front" GFCI, i.e., it does not have any receptacles on its face. It only has "reset" and "test" buttons on its face to, respectively, reset a tripped electrical connection inside of the GFCI and to test whether the ground-fault detection circuitry is operating properly. A water impenetrable cover 296 surrounds the face of the GFCI 294. The cover 296 can be made of a silicone overmolded plate. In this embodiment, the power wires from the power mains that are routed through the conduit in the ground are electrically connected to the "line" terminals on the GFCI and the power wires inside of power cable 274 are electrically connected to the "load" terminals of the GFCI.

Figure 13:
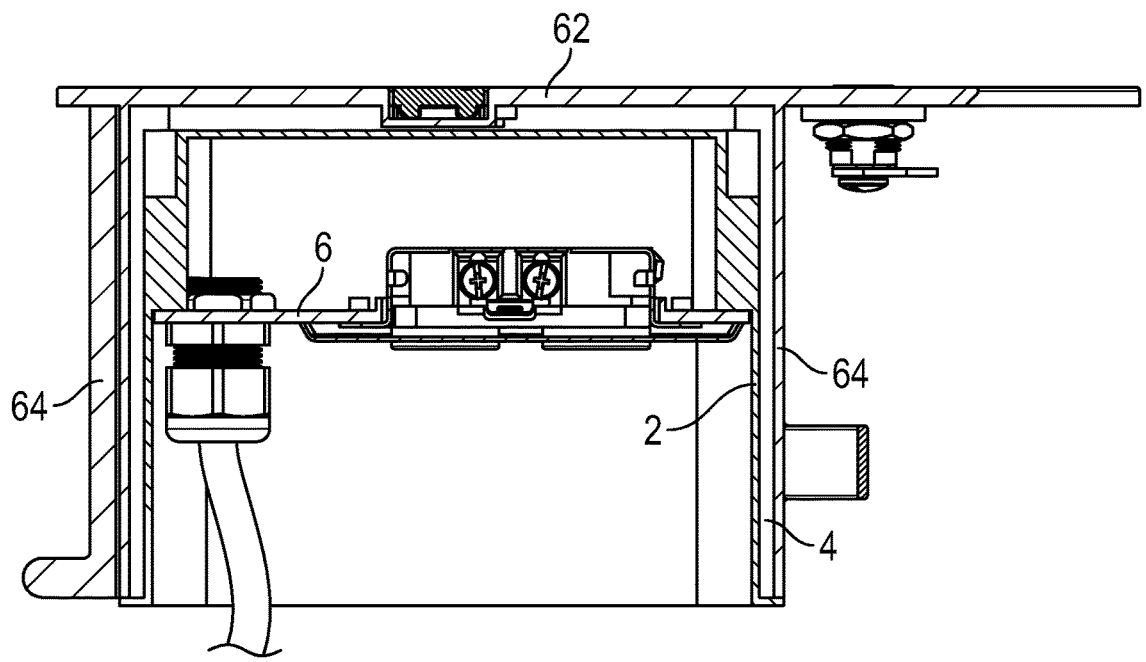
FIG. 13 shows a side cut-away view of a cover for the electrical box according to another embodiment of the present disclosure.

FIG. 13 shows the compartment 66 in greater detail. As can be seen in FIG. 13, an insert 2 is located between the side walls 64 and the interior space of the compartment 66. A portion of the insert also sits between the bottom surface of the top piece 62 of the cover 60 and the interior space of the compartment 66. The plate 6 that supports receptacles 68 can itself be supported by insert 2. An air gap 4 exists between the side walls 64 of the cover and the insert 2 as well as between the bottom surface of the top piece 62 of the cover and the insert 2. The air gap can be replaced with a thermally insulative material. The purpose of the air gap or thermally insulative material 4 is to prevent temperature changes in the cover from causing temperature changes in the air pocket protecting the electrical connection points inside of the compartment 66. Temperature changes in the air pocket can lead to condensation forming on the inner surfaces of the compartment 66, which defeats some of the protection provided by the air pocket. Second, temperature changes in the air pocket leads to fluctuations in its volume, which could cause the water level below the air pocket to rise.

FIGS. 14-18 depict an exemplary embodiment of an electrical box 310 in accordance with principles of the present disclosure wherein like numerals represent like elements. The electrical box 310 has a body 320, a cover 360 and an egress door 317. Referring to FIGS. 15-18, the cover 360 is connected to the body 320 through a sliding pin connection 312. The sliding pin connection 312 includes at least one sliding pin 313 connected to the cover 360. Similar to the electrical box 10 shown in FIGS. 1-7, the electrical box 310 has a cover flange 346 connected to the top of the body 320, a top piece 362 of the cover 360 and receptacles (not shown). The cover flange 346 has a sliding pin track 389 formed therein that includes a track rotation point 314.

The egress door 317 is connected to cover flange 346 through at least one pivot point 319. In FIGS. 15-18, the egress door 317 is shown in a closed position with an upper surface of the egress door 317 being flush with the top piece 362 of the cover 360 when the cover 360 is in the closed position shown in FIG. 15. As shown in FIGS. 19-22, the egress door 317 may have at least one biasing member 321 configured to bias the egress door 317 towards the closed position.

Figure 15:
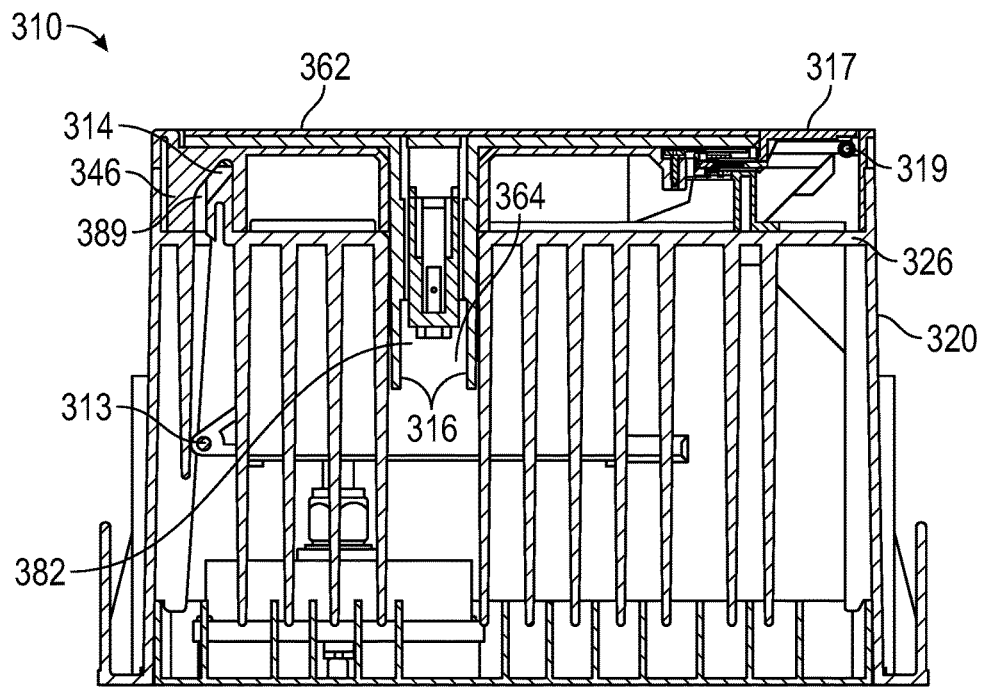
FIG. 15 shows a side cut-away view of the electrical box of FIG. 14 with the cover in fully closed position.
Figure 16:
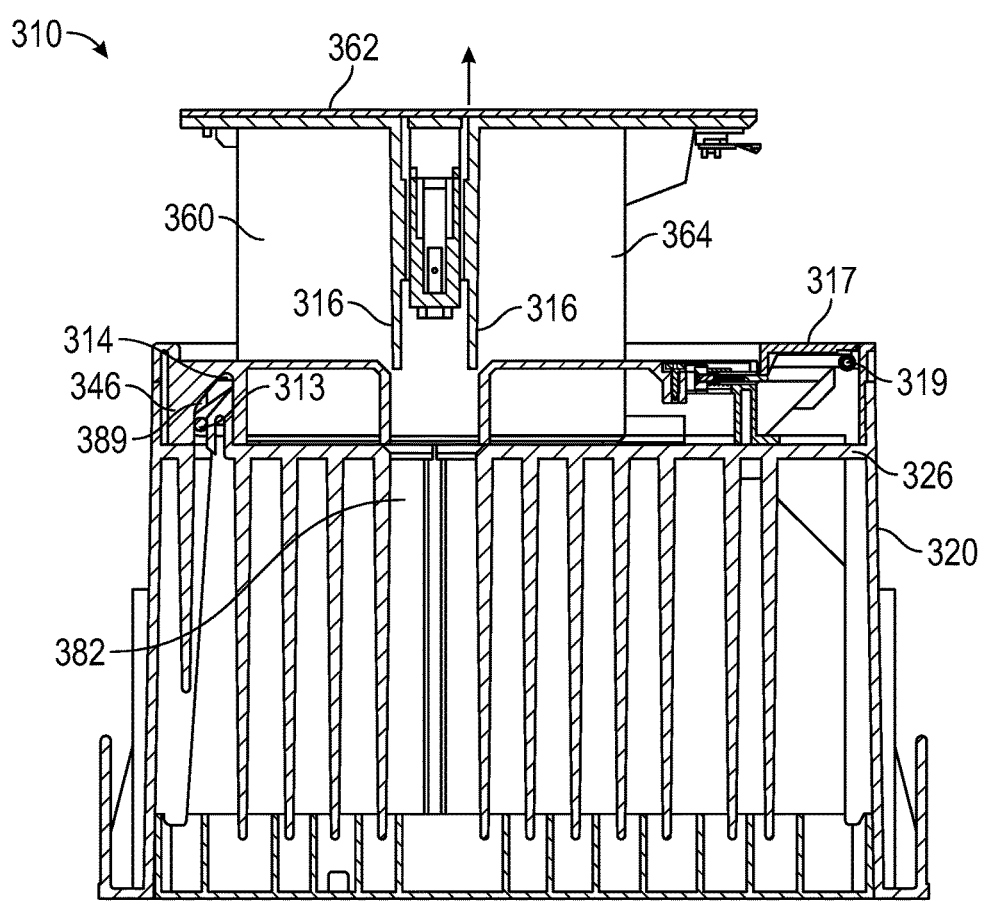
FIG. 16 shows a side cut-away view of the electrical box of FIG. 14 with the cover partially raised.
Figure 17:
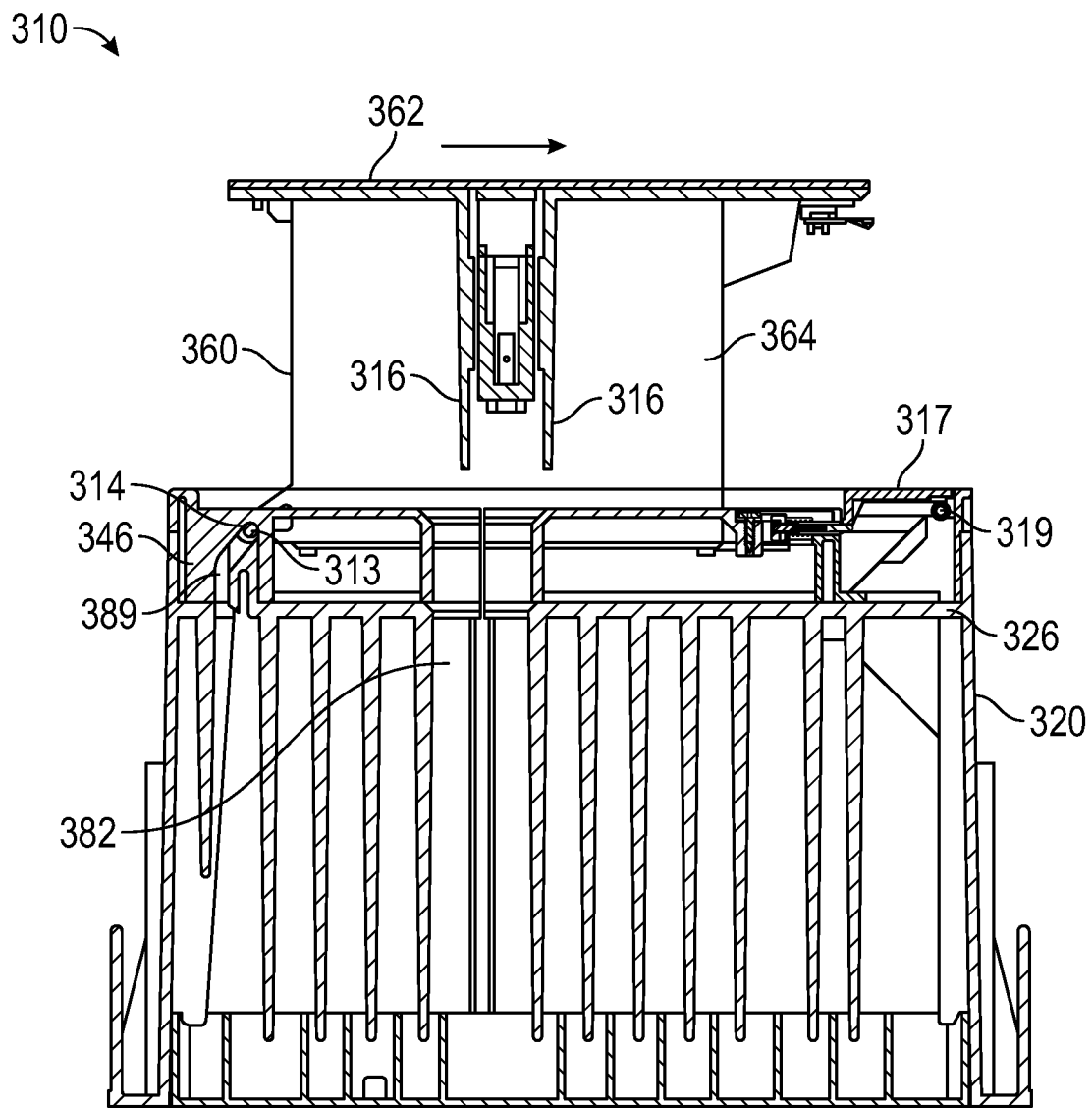
FIG. 17 shows a side cut-away view of the electrical box of FIG. 14 with the cover fully raised and translated forward.
Figure 18:
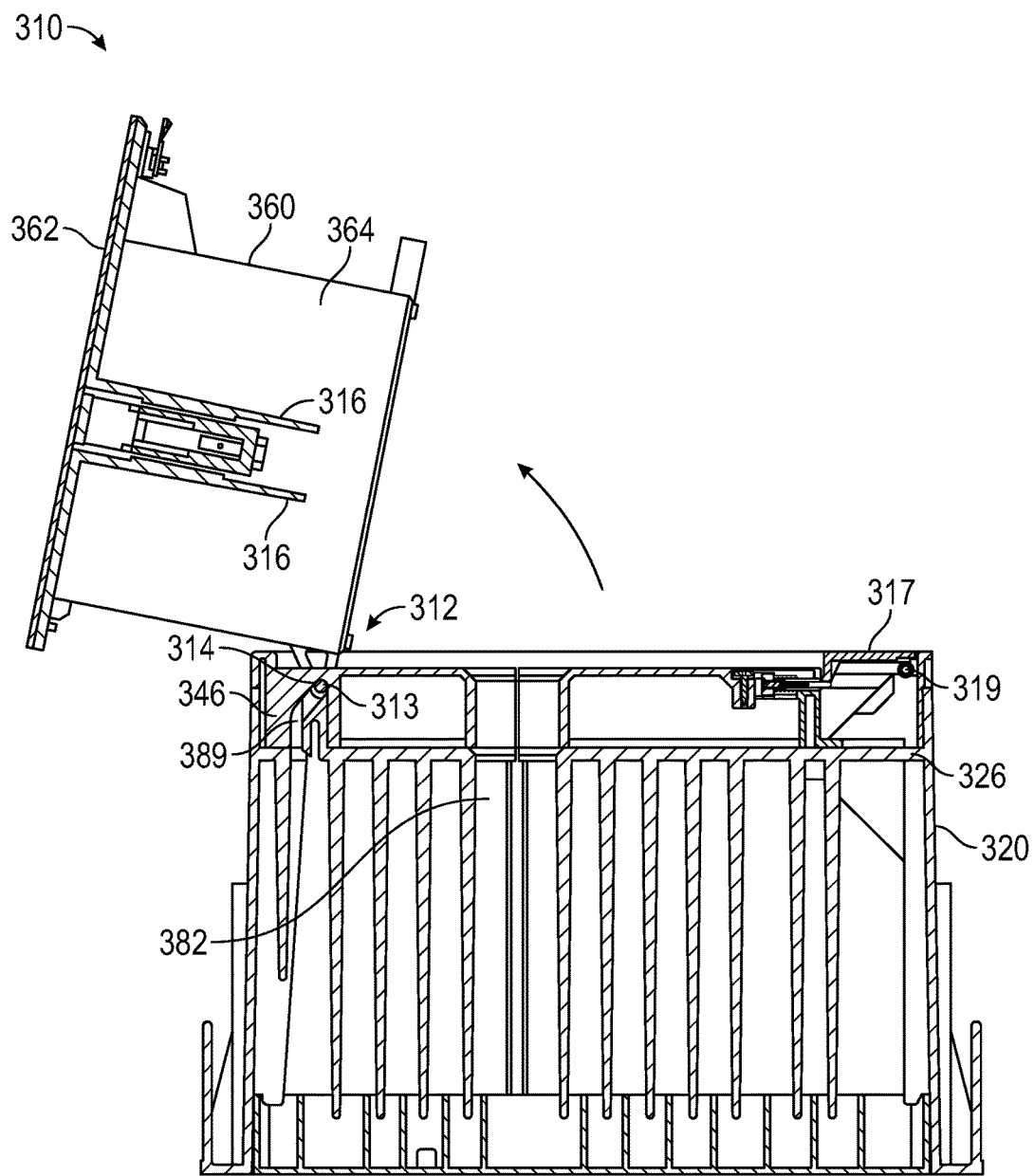
FIG. 18 shows a side cut-away view of the electrical box of FIG. 14 with the cover in fully opened position.

Referring to FIGS. 15-18, the sliding pin connection 312 permits the cover 360 to both rotate about the track rotation point 314 and to translate into and out of the body 320. When the cover 360 is in a fully closed position, as seen in FIG. 15, the faces of the receptacles (not shown) are in a substantially horizontal orientation. When the cover 360 is in a fully open position, as seen in FIG. 18, the faces of the receptacles not shown are in a substantially vertical orientation. To move the cover 360 from a fully closed position to a fully opened position, a user can engage handle 380 to vertically translate the cover within the body 320 from the position shown in FIG. 15 to the position shown in FIG. 16 without any rotation relative to the body 320 or translation in any other direction. As shown in FIG. 16, once the cover 360 reaches a certain vertical position relative to the body 320, the sliding pin 313 reaches and enters the sliding pin track 389. Then, as shown in FIG. 17, due to the shape and configuration of the sliding pin track 389, as the user continues to pull on the handle 380, the cover 360 simultaneously translates both horizontally and vertically and may begin to rotate relative to the body 320 until the sliding pin 313 reaches the track rotation point 314. As shown in FIG. 18, once the sliding pin 313 has reached the track rotation point 314, the cover 360 only rotates relative to the body 320 about the track rotation point 314 as the user continues to pull the handle 380 until fully opened position is reached.

The cover 360 includes guide extensions 316 on the outer surfaces of the side walls 364 that slide within a track 382 formed by the inner surfaces of the side walls 326 of the body 320 and/or the inner surfaces of the sidewalls of the cover flange 346. The guide extensions 316 in combination with the track 382 support the cover 360 to translate only vertically within the body 320 when translating from a fully closed position, shown in FIG. 15, to a partially raised position, shown in FIG. 16. As shown in FIG. 16, the guide extensions 316 may disengage from the track 382 when the cover 360 is raised to a certain point relative to the body 320.

The cover 360 can be moved from a fully opened position, shown in FIG. 18, to a fully closed position, shown in FIG. 15, by performing the above steps in reverse.

Figure 19:
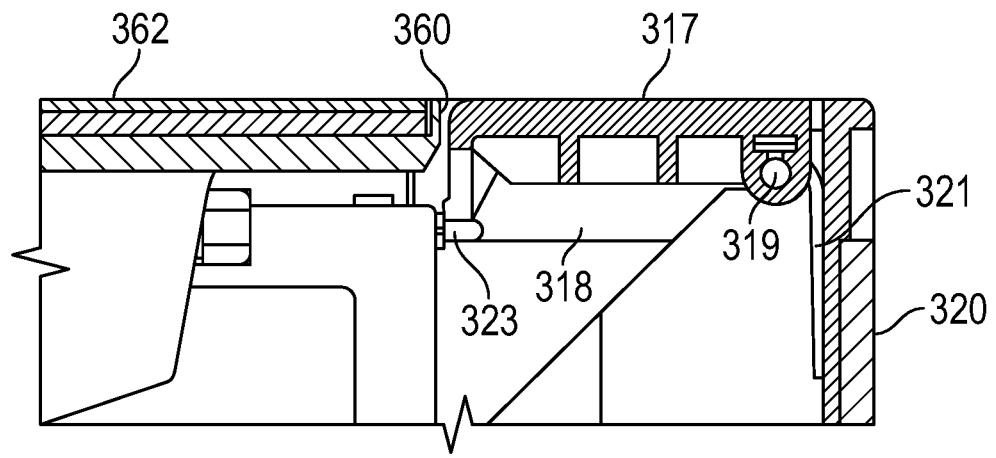
FIG. 19 shows a partial, side cut-away view of the electrical box of FIG. 15 with the cover in fully closed position and egress door in closed position.
Figure 20:
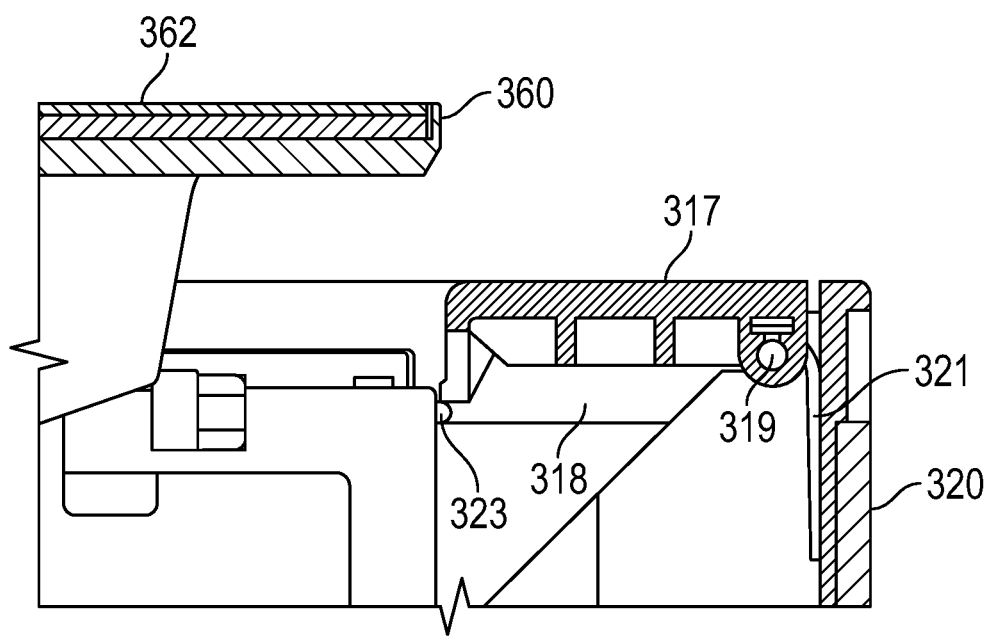
FIG. 20 shows a partial, side cut-away view of the electrical box of FIG. 15 with the cover partially raised and egress door in closed position.
Figure 21:
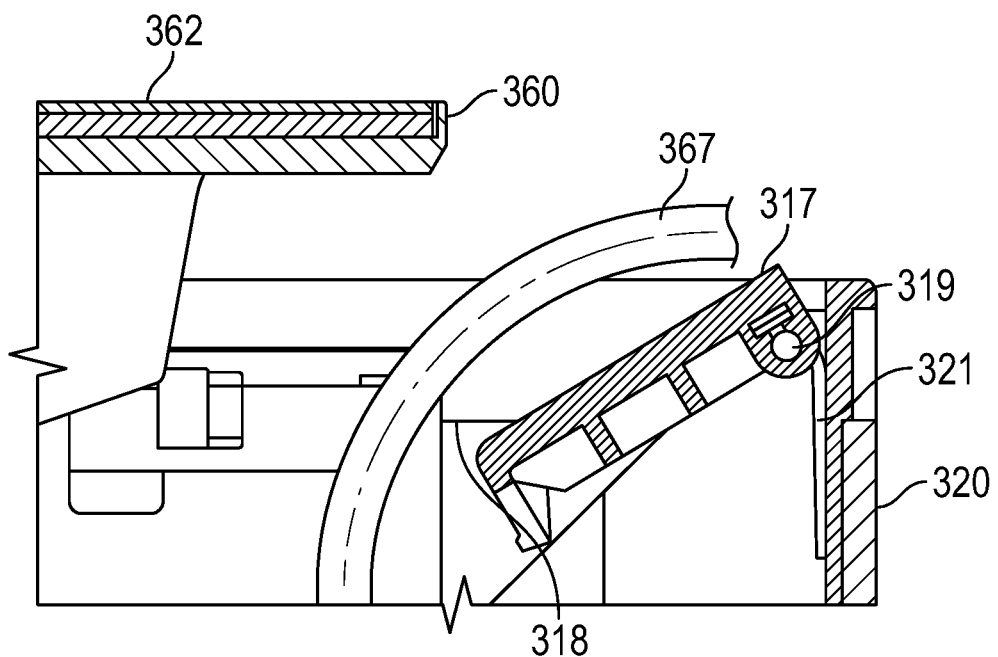
FIG. 21 shows a partial, side cut-away view of the electrical box of FIG. 15 with the cover partially raised and egress door in open position.
Figure 22:
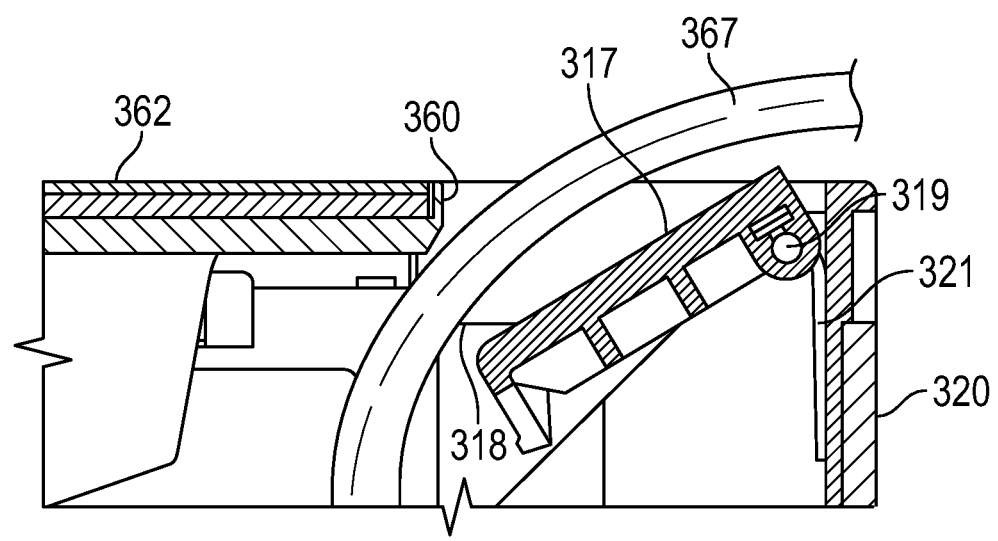
FIG. 22 shows a partial, side cut-away view of the electrical box of FIG. 15 with the cover in fully closed position and egress door in open position.
Figure 23:
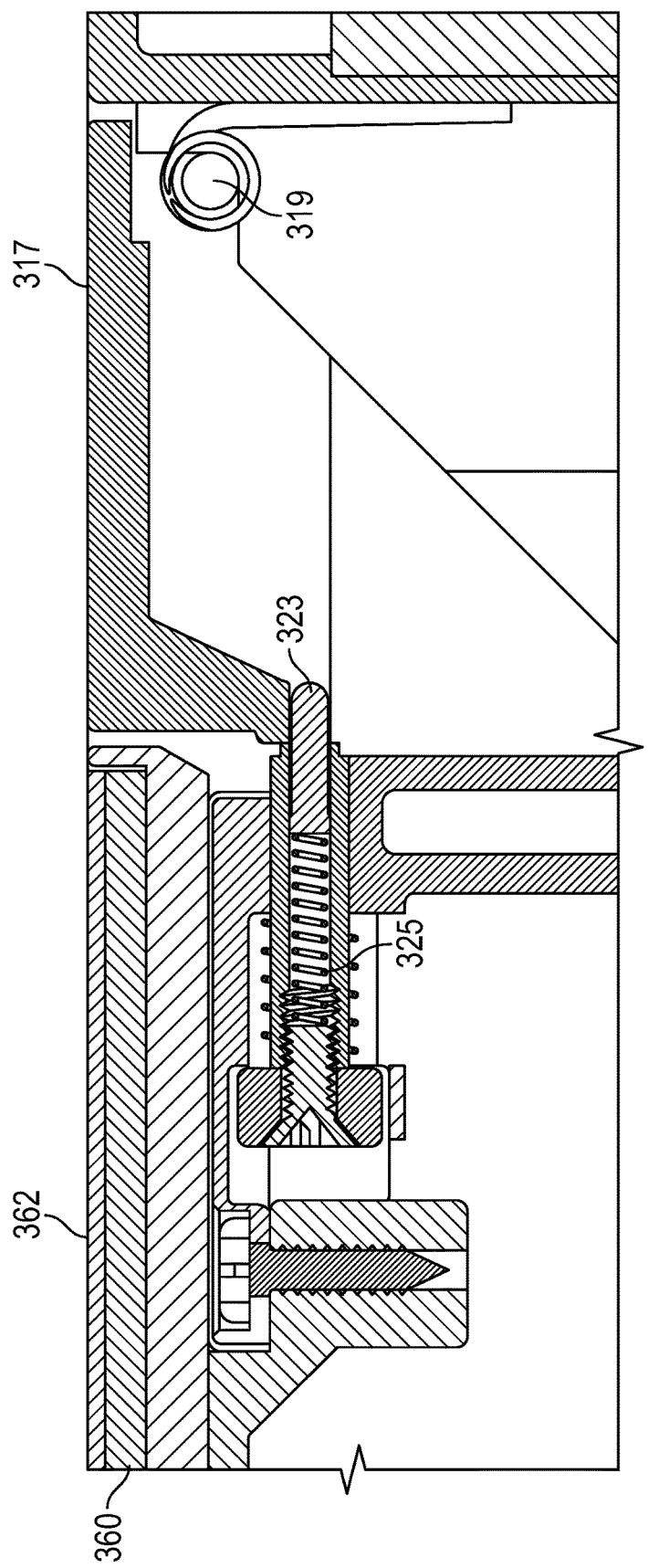
FIG. 23 shows a partial, side cut-away view of the electrical box of FIG. 15.

Referring to FIGS. 19-23, the egress door 317, when in an open position, permits the insertion of a power cord 367 into the electrical box 310 through egress space 318 for connection with the receptacle. As shown in FIGS. 19 and 23, when the cover 360 is in a fully closed position and the egress door 317 is also in a closed position a power cord is prevented from being inserted into the electrical box 310 through egress space 318. The cover flange 346 may comprise a locking mechanism such as at least one locking pin 323 that, when in a locked position, prevents the egress door 317 from being moved to an open position by being an obstruction in the travel path of the egress door 317. The locking pin 323 may have a locking pin biasing member 325 that biases the locking pin 323 towards an unlocked position, i.e. a position that does not cause obstruction in the travel path of the egress door 317. The locking pin biasing member 325 is prevented from biasing the locking pin 323 to the unlocked position because cover 360 is in the closed position. When cover 360 is moved to an open position then the locking pin biasing member 325 is free to bias the locking pin 323 to an unlocked position. Advantageously, the locking mechanism prevents unauthorized users from accessing the egress space 318 via actuation of the egress door 317 when the cover 360 is locked in a closed position with, for example, a lock and key arrangement. Additionally, the locking mechanism also advantageously keeps the egress door 317 in an upward position when locked so that the upper surface of the egress door is flush with the upper surface of the cover 360, thereby eliminating a potential tripping hazard when power cords are not egressing the box. As shown in FIG. 20, when the cover 360 is moved to a partially raised position the locking pin 323 is moved towards an unlocked position due to the bias of the locking pin biasing member 325 thereby causing the locking pin 323 to no longer be an obstruction in the travel path of the egress door 317. However, the egress door 317 remains in the closed position due to the bias applied by the at least one biasing member 321. FIG. 21 shows the cover 360 in the partially raised position and the egress door 317 moved to an open position against the bias of the at least one biasing member 321 thereby permitting insertion of power cord 367 into the electrical box 310 through the egress space 318. FIG. 22 shows the cover 360 in a fully closed position, but the egress door 317 remains in an open position due to the power cord 367 being an obstruction in the travel path of the egress door 317.

The electrical box 310 may be made of suitable materials to strengthen the structural integrity of the electrical box 310. For example, one or more components of the electrical box 310 could be made out of aluminum to strengthen the overall integrity of the electrical box. The electrical box 310 may be strong enough to withstand vehicular traffic driving over the upper surface, i.e. the cover 60, 360, of the electrical box 10, 310. Thus, the electrical box 310 may be placed, for example, in a parking lot, driveway or roadway. For example, when made of suitable materials, the electrical box 10, 310 may support motor vehicle traffic weight from 1 to 8,000 pounds.

Although features of the present disclosure have been described in connection with different embodiments for simplicity, one of ordinary skill in the art should readily understand that the various features may be applicable to, and readily incorporated into, the other embodiments.

As will be recognized by those of ordinary skill in the pertinent art, numerous changes and modifications may be made to the above-described embodiments of the present disclosure without departing from the spirit of the invention as defined in the appended claims. Accordingly, the particular embodiments described in this specification are to be taken as merely illustrative and not limiting.

What is claimed is:

1. An electrical box, comprising:
a body;
a cover that is movable relative to the body, the cover comprising a top surface, a bottom surface, and sidewalls extending outward from the bottom surface to form a compartment the compartment having an opening opposite the bottom surface at a bottom of the cover; and an electrical connection point that is mounted to the cover within the compartment; wherein the cover is connected to the body via a sliding hinge connection that includes a hinge pin slidable within a track, the cover rotating about the hinge pin relative to the body via the sliding hinge connection when the hinge pin is at an upper end of the track as well as translating vertically relative to the body without additional rotation from a first position in which the top surface of the cover is substantially level with a top of a cover flange of the body to a second position in which the bottom of the cover is substantially level with the top of the cover flange as the hinge pin slides within the track so that the cover moves relative to the body so as to maintain a minimum volume of an air pocket within the compartment against a water level within the body.

2. The electrical box of claim 1, wherein the cover can only translate vertically relative to the body for at least a portion of a movable path of the cover.

3. The electrical box of claim 1, wherein the cover can simultaneously translate vertically and horizontally relative to the body for at least a portion of a movable path of the cover.

4. The electrical box of claim 1,
wherein the cover flange has a sliding pin track formed therein; and
wherein the hinge pin of the sliding hinge connection is connected to the cover and is movable within the sliding pin track.

5. The electrical box of claim 1, further comprising an egress door movable relative to the body.

6. The electrical box of claim 5, further comprising a biasing member configured to bias the egress door to a closed position to close a cable opening.

7. The electrical box of claim 5, further comprising at least one locking pin movable to a locked position, wherein, when the locking pin is in the locked position, the locking pin prevents the egress door from being moved from a closed position to an open position.

8. The electrical box of claim 7, further comprising a biasing member configured to bias the locking pin towards an unlocked position, wherein, when the locking pin is in the unlocked position, the locking pin does not prevent the egress door from being moved from a closed position to an open position.

9. The electrical box of claim 8, wherein when the cover is in a the first position closing the electrical box, the cover maintains the locking pin in the locked position against the bias of the biasing member to maintain the egress door in the closed position and close a cable opening.

10. The electrical box of claim 1, further comprising a first interlocking tab and a second interlocking tab that are both connected to the body.

11. The electrical box of claim 10, wherein the first interlocking tab is configured to interlock with a corresponding second interlocking tab of a similar electrical box.

12. The electrical box of claim 1, wherein the cover is aluminum.

13. The electrical box of claim 1, wherein the cover is configured to support the weight of motor vehicle traffic within the range of 1 to 8,000 pounds.

14. An electrical box, comprising:
a body;
a cover attached to the body by a sliding pin connection allowing the cover to rotate as well as translate relative to the body without additional rotation from a first position in which a top surface of the cover is substantially level with a top of a cover flange of the body to a second position in which a bottom of the cover is substantially level with the top of the cover flange, the cover comprising the top surface, a bottom surface, and sidewalls extending outward from the bottom surface to a bottom of the cover to form a compartment; and
an electrical connection point that is mounted to the cover within the compartment;
wherein a guide extension formed on one of the body or the cover interacts with a track formed on the other of the body or the cover for a portion of a movable path of the cover relative to the body to allow only vertical translation of the cover relative to the body for the portion of the movable path.

15. The electrical box of claim 14, further comprising an egress door pivotable relative to the body.

16. The electrical box of claim 15, further comprising a biasing member configured to bias the egress door to a closed position to close a cable opening.

17. The electrical box of claim 15, further comprising at least one locking pin movable to a locked position, wherein, when the at least one locking pin is in the locked position, the at least one locking pin prevents the egress door from being pivoted from a closed position to an open position.

18. The electrical box of claim 17, further comprising a biasing member configured to bias the at least one locking pin toward an unlocked position, wherein, when the at least one locking pin is in the unlocked position, the at least one locking pin does not prevent the egress door from being moved from a closed position to an open position.

19. A method for opening an electrical box comprising:
translating a cover of the electrical box in an upward direction from a first position in which a top of the cover is substantially level with a top of a cover flange mounted on a body of the electrical box to a second position in which the top of the cover is above the top of the cover flange as a pin slides in a first portion of a track;
translating the cover of the electrical box simultaneously in an upward and horizontal direction from the second position to a third position in which a bottom of the cover is substantially level with the top of the cover flange as the in slides in a second portion of the track; and
after the cover has reached the third position rotating the cover about a track rotation point to a fourth position.

* * * * *

UNITED STATES PATENT AND TRADEMARK OFFICE
CERTIFICATE OF CORRECTION

| | | |
|---|---|---|
| PATENT NO. | : 9,653,897 B2 | Page 1 of 1 |
| APPLICATION NO. | : 15/240299 | |
| DATED | : May 16, 2017 | |
| INVENTOR(S) | : Jeffrey Hemingway, Richard R. Picard and Steven C. Thibault | |

It is certified that error appears in the above-identified patent and that said Letters Patent is hereby corrected as shown below:

In the Claims

Column 11, Claim 9, Line 41, "a" should be deleted; and
Column 12, Claim 19, Line 51, "in" should read as "pin".

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*